(12) United States Patent
Limaye et al.

(10) Patent No.: US 8,450,825 B2
(45) Date of Patent: May 28, 2013

(54) SEMICONDUCTOR PACKAGE

(75) Inventors: Paresh Limaye, Leuven (BE); Jan Vanfleteren, Gentbrugge (BE); Eric Beyne, Leuven (BE)

(73) Assignees: IMEC, Leuven (BE); Katholieke Universiteit Leuven, Leuven (BE); Universiteit Gent, Gent (BE)

( * ) Notice: Subject to any disclaimer, the term of this patent is extended or adjusted under 35 U.S.C. 154(b) by 242 days.

(21) Appl. No.: 12/848,057

(22) Filed: Jul. 30, 2010

(65) Prior Publication Data

US 2011/0037179 A1      Feb. 17, 2011

Related U.S. Application Data

(63) Continuation of application No. PCT/EP2009/051089, filed on Jan. 30, 2009.

(60) Provisional application No. 61/025,668, filed on Feb. 1, 2008.

(51) Int. Cl.
*H01L 23/36* (2006.01)

(52) U.S. Cl.
USPC .............. 257/467; 257/666; 257/E21.505

(58) Field of Classification Search
USPC ..................... 257/666, 467, E21.505
See application file for complete search history.

(56) References Cited

U.S. PATENT DOCUMENTS

| 5,250,839 | A | 10/1993 | Katoh et al. |
| 5,455,446 | A * | 10/1995 | Suppelsa et al. ............. 257/467 |
| 6,173,489 | B1 | 1/2001 | McMahon et al. |
| 6,486,003 | B1 * | 11/2002 | Fjelstad ...................... 438/117 |
| 2002/0117330 | A1 * | 8/2002 | Eldridge et al. ............. 174/260 |
| 2004/0173903 | A1 | 9/2004 | Yang et al. |
| 2004/0183193 | A1 | 9/2004 | Koide et al. |
| 2007/0273023 | A1 | 11/2007 | Zhao et al. |

FOREIGN PATENT DOCUMENTS

| EP | 0 252 518 | 1/1988 |
| WO | WO 00/11716 | 3/2000 |

OTHER PUBLICATIONS

International Search Report and Written Opinion mailed Aug. 4, 2009 in International Application No. PCT/EP2009/051089.

* cited by examiner

*Primary Examiner* — Steven J Fulk
(74) *Attorney, Agent, or Firm* — Knobbe Martens Olson & Bear LLP

(57) ABSTRACT

A semiconductor package is disclosed. In one aspect, the package includes a base frame and a wiring substrate mounted on the base frame. The base frame has two pieces made of a material with respectively a first and a second coefficient of thermal expansion and connected to each other via resilient connecting structures. The wiring substrate has electric wiring tracks providing the electric connection between first and second bond pads, provided for being electrically connected to bond pads on respectively a die and a printed wiring board. The electrical wiring tracks have flexible parts provided to expand and contract along with the resilient connecting structures.

21 Claims, 18 Drawing Sheets

FIG. 12e  FIG. 12f

SEMICONDUCTOR PACKAGE

CROSS REFERENCE TO RELATED APPLICATIONS

This application is a continuation of PCT Application No. PCT/EP2009/051089, filed Jan. 30, 2009, which claims priority under 35 U.S.C. §119(e) to U.S. provisional patent application 61/025,668 filed on Feb. 1, 2008. Each of the above applications is incorporated herein by reference in its entirety.

BACKGROUND OF THE INVENTION

1. Field of the Invention

The present invention relates to a semiconductor package for connecting an integrated circuit die to a printed wiring board. Further, the invention relates to a method of manufacturing such a semiconductor package.

2. Description of the Related Technology

One of the challenges in the packaging of advanced semiconductor devices is to reduce the packaging process stress in the package. The stress generated in a package can come from various sources. One of the sources of the stress is the difference in the coefficient of thermal expansions (CTE) of the different materials used for packaging. A typical packaged device experiences exposure to different temperatures during its entire operational life time. During each of such temperature variations, the different materials in the package expand or contract at different rates depending on whether the package is heated up or cooled down. The differential expansion of the various packaging layers can cause severe stress on the semiconductor device.

In U.S. Pat. No. 6,173,489 B1 "stress deflectors" are introduced in the substrate by isolating a portion of the substrate underneath the bond pads of the flip chip so that the integrated circuit is allowed to float and expand at a different rate. Therefore voids are introduced to allow the part of the substrate underneath the flip chip to float. This concept can be used for printed wiring boards to allow the package to float with respect to the printed wiring board (PWB).

In WO00/11716 stress is reduced on printed wiring boards with a void or a constructive void.

The disadvantage of the approaches presented in U.S. Pat. No. 6,173,489 and WO00/11716 is the introduction of a void in the PWB. This requires additional process steps. Furthermore, presence of voids or constructive voids in the printed circuit board (PCB) or the substrate may result in paths for moisture to be trapped. This can cause permanent damage to the package or the board during the melting of the soldered interconnections. Furthermore, the concept of using an insert piece to create a set of floating bond pads requires extra process steps.

In U.S. Pat. No. 5,250,839 a thermal stress absorber is used for laminated leadframe devices to absorb the thermal disparity between two parts of the leadframe. This approach is used however only for the stresses arising from the leadframe manufacturing due to welding of the two metals. The thermal disparity in the operation of the package cannot be absorbed since the laminated leadframe is overmolded as a part of packaging process.

A conventional flip chip package comprises an interposer substrate which is with a first side electrically connected to an integrated circuit die. The connection is for instance done with the aid of solder interconnections connecting bond pads on the die with corresponding bond pads on a first side of the interposer substrate. The thus formed flip chip assembly is preferably under filled, which involves dispensing a liquid polymer adjacent to one edge of the assembled integrated circuit and allowing the polymer material to flow underneath the assembly due to capillary forces. The assembly is then exposed to higher temperatures to allow cross linking of the polymer which renders it solid and which allows the stresses in the assembly to be redistributed over a larger area of the integrated circuit.

In general, the flip chip packages are packaged with ceramic or plastic substrates. Ceramic materials have a CTE which is close to that of silicon and hence the stress induced on an integrated circuit die assembled on a ceramic substrate is low. In combination with the use of an under fill material, these combinations produce a very reliable soldered interconnection at the flip chip level.

Problems arise when a second side of the interposer substrate is electrically connected to a printed wiring board. The connection is for instance done with the aid of solder joints connecting bond pads on the PWB with corresponding bond pads on the interposer substrate. When such a ceramic flip chip package is assembled on a conventional PWB there is usually a very large CTE mismatch between the package and the PWB. In case of a ceramic flip chip package, the CTE is typically about 3-7 ppm/° C., while the CTE of a conventional PWB is typically about 16-18 ppm/° C. When this assembly is subjected to temperature variations, the solder joints connecting the package to the PWB fail very quickly. These situations require use of special and expensive board level interconnection solutions.

Conversely, the interposer substrate of the flip chip package can also be made of a material with a CTE closer to that of the PWB, for instance of plastic composite material. This substrate results in a better board level interconnection reliability and a reduction of the stress between the PWB and interposer substrate. However, the CTE mismatch between the integrated circuit die and the interposer substrate will now be much greater than in the case of a ceramic substrate which will require the use of under fill material that may induce a high amount of stress on the integrated circuit die.

The continued reduction of the transistor dimensions at the device level has resulted in reduced interconnect dimensions, especially on the die. For improving the performance of semiconductor devices, new dielectric materials with lower dielectric constant (commonly referred to as low K dielectrics) are currently in use. Ultra low K back end of line (BEOL) on the die often uses porous dielectric materials with low mechanical strength. As these low k dielectrics have reduced mechanical strength compared to conventional dielectric materials, they are more susceptible to failures under stress. Flip chip packaging for ultra low K devices requires a low stress packaging approach. Any excess stress imposed by the packaging process results in damage to the BEOL stack resulting in the device failure. Hence the packaging of the die requires reduction of the overall stress in the package for improved package reliability. One of the most important sources of the stress is the difference in the coefficient of thermal expansions (CTE) of the different materials used for packaging.

Along with the introduction of the ultra low K BEOL, the interconnect dimensions are also shrinking down for instance, down to about 20 micron for peripheral array devices, which requires use of fine pitch wiring to route out all the interconnects from the die level to the board level interconnects.

SUMMARY OF CERTAIN INVENTIVE ASPECTS

Certain inventive aspects relate to a semiconductor package with reduced stress and a method for fabricating such semiconductor packages, allowing the use of thin film technologies, fine pitch wiring and the integration of low k dielectrics.

One aspect relates to a semiconductor package suitable for packaging a die in order to form for instance a flip chip package, which may then be assembled onto a printed wiring board, but is not limited thereto.

In one aspect, a semiconductor package comprises an interposer substrate which comprises a mechanical support structure and wiring substrate which are connected to each other. The mechanical support structure, hereinafter called the base frame, is provided to mechanically support the integrated circuit die on the PWB it is connected to.

The base frame comprises two pieces with a different CTE. The first and second pieces are connected to each other with deformable connecting structures which are able to expand and contract to compensate for the differential thermal expansion between the first and second pieces, thus also the differential thermal expansion between the integrated circuit die and PWB. Those resilient connecting structures are hereinafter called the compliant connecting structures (CCS).

The interposer substrate comprises a number of bond pads which are connected with each other via electrical wiring tracks on a wiring substrate, which is mounted to the base frame. The electrical wiring tracks and pads may be fabricated separately on a substrate or may be fabricated on the base frame itself with suitable dielectric deposition processes. The interposer substrate in particular comprises first bond pads provided for being electrically connected to bond pads of the integrated circuit die and second bond pads electrically connected to the first bond pads via electrical wiring tracks and provided for being electrically connected to bond pads of the printed wiring board.

The zone between the first and second piece of the base frame which comprises the CCS is called the zone of thermal mismatch. This zone corresponds to a similar zone on the wiring substrate. The wiring tracks in the zone of thermal mismatch comprise flexible parts, designed to expand and contract along with the CCS of the base frame.

Upon connection of the semiconductor package to two materials with a different CTE, for instance upon connection to an integrated circuit die and a PWB, the semiconductor package is able to reduce stress, caused by the difference in CTE between the integrated circuit die and the PWB, in the obtained semiconductor device as follows. The CTE of the first piece of the base frame is chosen to match the CTE of the integrated circuit die, while the CTE of the second piece of the base frame is chosen to match the CTE of the PWB. By electrically connecting the first piece with the integrated circuit die and the second piece with the PWB, the semiconductor package according to one aspect is able to segregate the thermal expansion of the integrated circuit die from the expansion of the PWB on which the package is assembled. The CCS and electrical wiring tracks in the region of thermal mismatch are able to compensate for the difference in thermal expansion between the PWB and die and as such are able to reduce stress is the obtained semiconductor device.

The first bond pads can be provided onto the wiring substrate and the second bond pads can be provided onto the base frame. The connection of an IC die to a PWB is then established by connecting the IC die with its bond pads to the first bond pads of the wiring substrate and connecting the PWB with its bond pads to the second bond pads of the base frame. In this embodiment, the IC die and PWB are connected to opposite sides of the semiconductor package. At least part of the first and second bond pads are electrically connected via electrical wiring tracks.

In one aspect, the semiconductor package allows connecting the IC die and PWB on the same side of the semiconductor package. This is achieved by providing the first and second bond pads on the wiring substrate and connecting them to bond pads on respectively the IC die and PWB. Such an embodiment has the advantage that the height of the overall semiconductor device can be reduced. This is due to the fact that the die as well as the PWB can be assembled to the same side of the interposer substrate, while in conventional flip chip packages, the die and PWB are assembled on opposite sides of the interposer substrate.

In one aspect, the semiconductor package, by the separation of the mechanical connection and the electrical connection between the die and the PWB, also allows the use of thin film technologies, fine pitch wiring and the integration of low k dielectrics.

With the term "matching of thermal expansion coefficient between A and B" as used herein is meant that the difference in thermal expansion coefficient between A and B is lower than about 20%.

More preferably, the difference in thermal expansion coefficient between the first and the second piece of the base frame is lower than about 10%, or even better lower than about 5%, allowing in a further reduction of the stress.

Preferably, the first piece of the base frame is a centre piece and the second piece of the base frame is a window piece surrounding the centre piece. This has the advantage that the centre piece can be mechanically suspended in the window piece, with CSS around its circumference, providing a stable support for the die.

A main plane of thermal expansion of the first and second piece can be oriented in whatever direction with respect to a main plane of thermal expansion of at least one of the CSS.

In a first preferred embodiment, the main plane of thermal expansion of the first and second piece is parallel to the main plane of thermal expansion of at least one of the CSS. Such a system has the advantage that the deformation of the package can be controlled during thermal cycling.

In a second preferred embodiment, the main plane of thermal expansion of the first and second piece is perpendicular to the main plane of thermal expansion of at least one of the CSS. Such a system has the advantage that the deformation of the package can be controlled during thermal cycling.

The first and second pieces can be located in the same plane. In a preferred embodiment, the first piece extends in a different plane as the second piece. Such an embodiment has the advantage that thicker dies or interconnections with smaller height may be accommodated.

In a preferred embodiment, the semiconductor device is pre-deformed in the region of the wiring substrate next to the gap between the centre piece and the window piece of the base frame. This pre-deformation allows the substrate wiring tracks to accommodate the expansion difference between the centre piece and the window piece in the package.

One aspect relates to several methods for manufacturing such a semiconductor package.

BRIEF DESCRIPTION OF THE DRAWINGS

The invention will be further elucidated by means of the following description and the appended drawings.

FIGS. 12(a)-12(g) are schematic representations from the top view and the cross section view of the semiconductor package during different steps of the manufacturing process flow to fabricate a wiring substrate with local deformable electrical connections in the region on the substrate adjacent to the region between the window piece and the centre piece of the base frame to accommodate the difference in expansion of the centre piece and the window piece.

DETAILED DESCRIPTION OF CERTAIN ILLUSTRATIVE EMBODIMENTS

Figure 1:
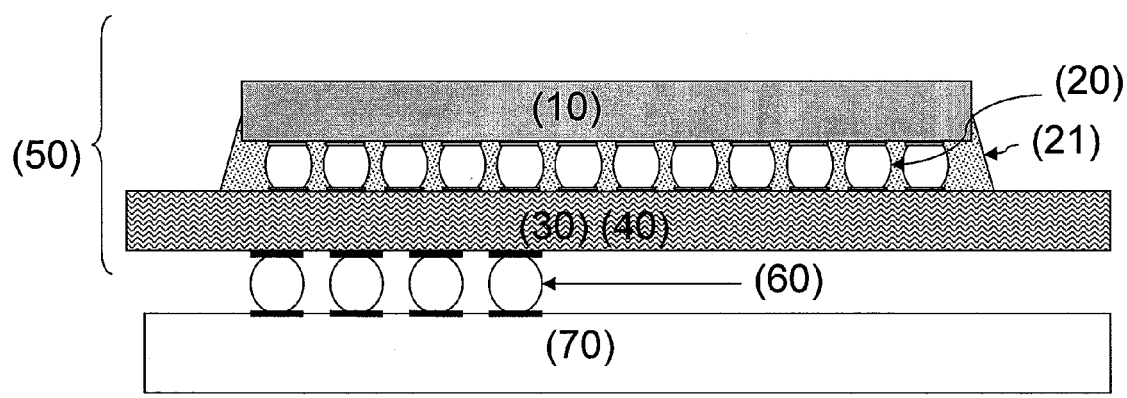
FIG. 1 is a schematic view of a flip chip package mounted on a printed wiring board according to the state in the art.

The present invention is described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third, and the like in the description and in the claims, are used for distinguishing between similar elements and not necessarily for describing a sequential or chronological order. The terms are interchangeable under appropriate circumstances and the embodiments of the invention can operate in other sequences than those described or illustrated herein.

Moreover, the terms top, bottom, over, under, and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

FIG. 1 shows a schematic view of a conventional flip chip package mounted on a printed wiring board according to the state of the art.

The flip chip package (50) shown in FIG. 1 comprises an integrated circuit die (10) which is attached directly to a first side of a substrate (30) with wiring (40) with the aid of solder interconnections (20) connecting bond pads on the die (10) with corresponding bond pads on the wiring substrate (30, 40). A second side of the substrate (30, 40) is connected to a printed wiring board (PWB) (70) with the aid of solder joints (60) connecting the bond pads on the PWB (70) with corresponding bond pads on the substrate.

Non-soldered alternatives, such as metallic interconnections or non-metallic electrically conductive interconnections, such as an Au stud bump, electrically conductive adhesives etc. also exist.

The flip chip package (50) shown in FIG. 1 further comprises a under fill material (21) provided between the solder interconnections (20). The under fill material (21) is provided to reduce overall stress on the flip chip solder joints.

Because the thermal expansion coefficients of the integrated circuit die (10) and the PWB (70) in general differ, the substrate with wiring (30, 40) can be chosen such as to match either the thermal expansion coefficient of the integrated circuit die (10), resulting in stress between the substrate (30, 40) and the PWB (70), or to match that of the PWB (70), resulting in stress between the substrate (30, 40) and the die (10).

Certain embodiment relate to a semiconductor package which allows reducing the stress induced in the package when mounted on two layers with a different coefficient of thermal expansion, for instance when mounted onto a PWB and IC die.

Figure 2:
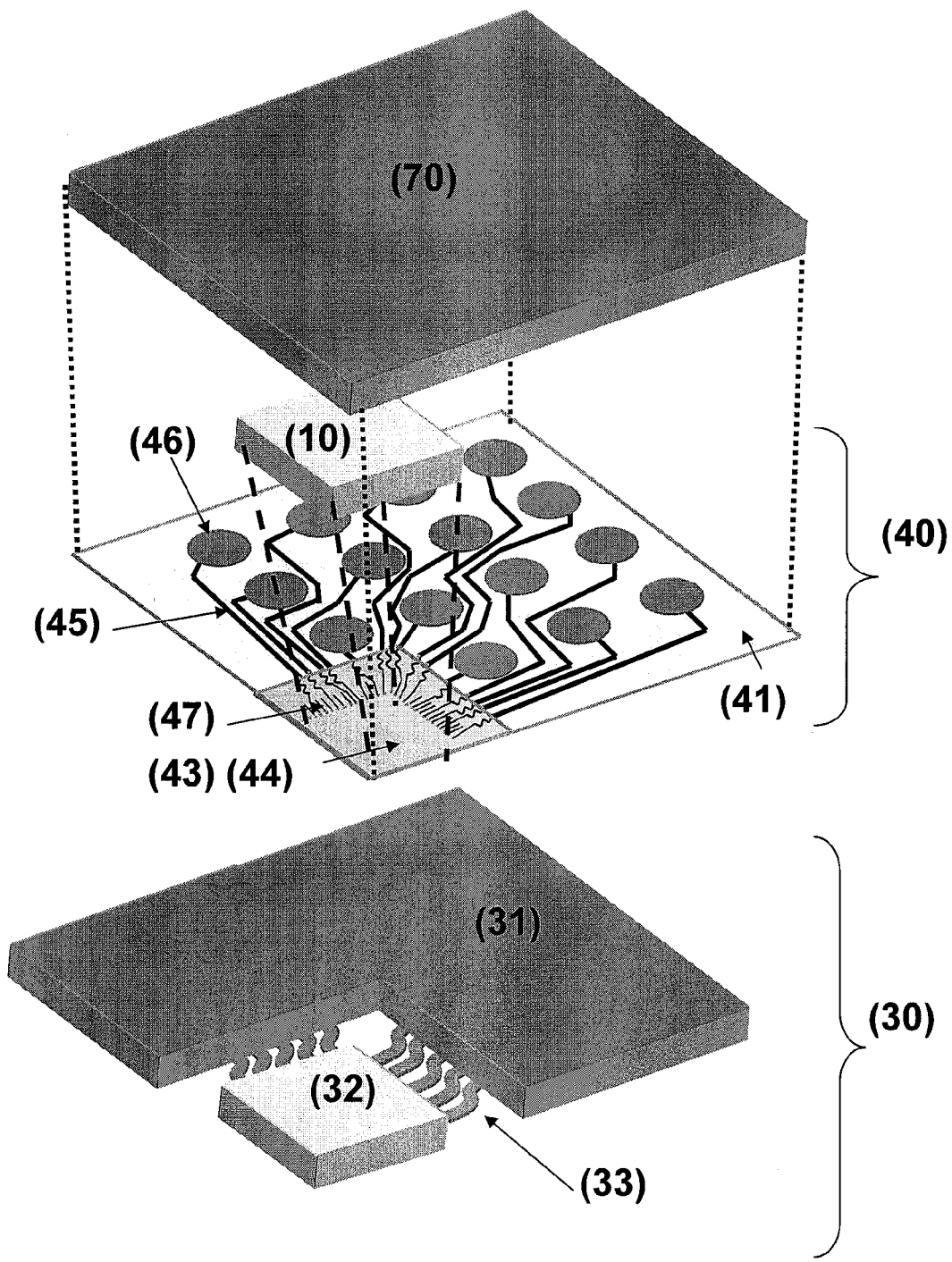
FIG. 2 is a three-dimensional elevated view of a quarter section of a semiconductor package according to one embodiment.
Figure 3A:
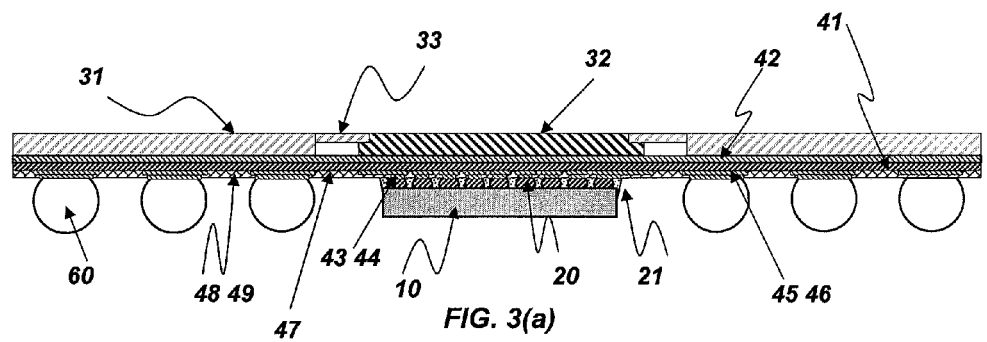
FIG. 3(a) is a cross section of an embodiment of the semiconductor package shown in FIG. 2.
Figure 3B:
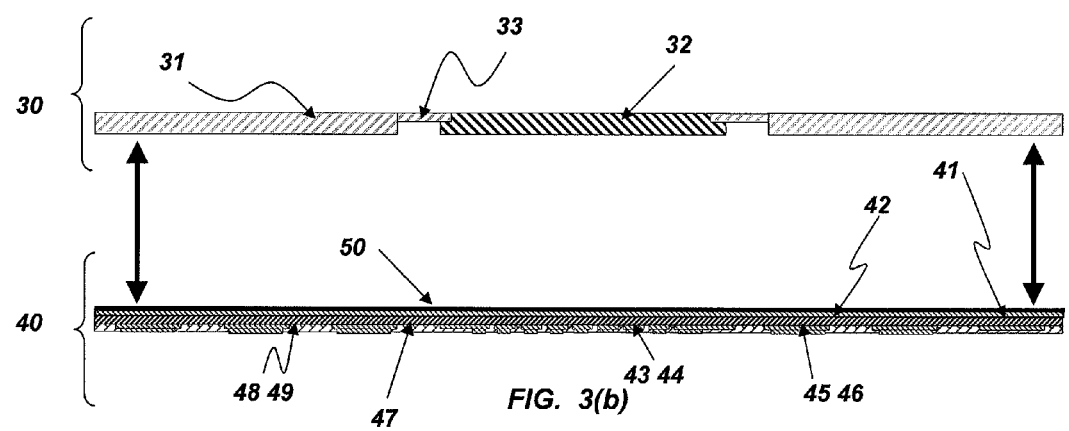
FIG. 3(b) is a cross section of the wiring substrate and the base frame of the semiconductor package shown in FIG. 3(a).
Figure 3C:
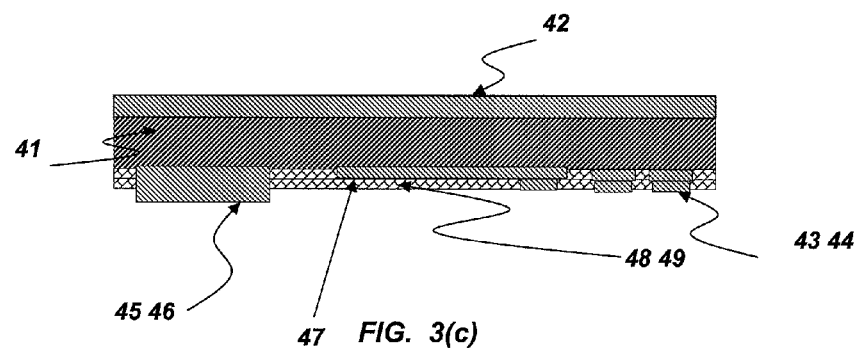
FIG. 3(c) is a cross section of a section of the wiring substrate shown in FIG. 3(b).

A first embodiment of a semiconductor package according to the present invention is shown in FIG. 2 and in detail in FIGS. 3(a)-3(c). The semiconductor package comprises an interposer substrate (30, 40) which is with solder connections (20) electrically connected to an integrated circuit die (10) and with solder joints (60) connectable to a PWB (70). In order to reduce stress in the semiconductor device as a result of a thermal expansion mismatch between the PWB and the integrated circuit die, the semiconductor package comprises an interposer substrate which comprises two parts:
  a base frame (30), that isolates the expansion mismatch and electrical wiring on a substrate (40), called wiring substrate (40), that also incorporates localized expansion means corresponding to the isolation zone on the mechanical support structure The mechanical support structure or base frame (30) is made of two pieces with a different coefficient of thermal expansion. Preferably the first piece is a centre piece (32) made of a material having a thermal expansion coefficient matching the thermal expansion coefficient of the IC die (10) and the second piece is a window piece (31) made of a material having a thermal expansion coefficient matching the thermal expansion coefficient of the PWB (70) and surrounding the centre piece.

The base frame (30) may be fabricated using various metals such as but not limited to copper for the window piece (31), kovar, Alloy42 or Invar for the centre piece (32). The base frame can also be fabricated using dielectric materials or can be a combination of metal, conducting, semi-conducting and dielectric materials. The base frame can be made of dielectric materials covered with a conducting or metal layer at one or both sides. The base frame can be fabricated using but not limited to etching, stamping, welding, brazing and other manufacturing processes conventionally used for the manufacture of lead frames.

The differential expansion of the centre piece and the window piece can be absorbed by spring structures (33) placed between the pieces (31) and (32) made of materials with different expansion properties. These spring structures are mechanical connections with low stiffness connecting the regions of the substrate which have different coefficients of thermal expansions. The differential expansion of the two components (31) and (32) is absorbed primarily by these spring structures, also called compliant connecting structures (33) placed between the components made of materials with different expansion properties.

The wiring substrate (40) shown in FIGS. 2 and 3(a)-3(c) comprise electrical wiring tracks connecting bond pads (43) (44) (45) (46) (48) (49) provided on a substrate (41). The electrical wiring tracks and pads may be fabricated separately on a substrate (41) that can provide lateral expansion. Therefore the substrate can be pre-metallized on both sides of a dielectric material and patterned to form a wiring circuit. The wiring substrate (40) may also be fabricated on the base frame or mechanical support structure itself with suitable dielectric deposition processes. The wiring tracks (43) (44) (45) (46) (48) (49) on the wiring substrate may be manufactured with sputtering, electroplating, etching and other manufacturing processes including thin film manufacturing processes.

The zone provided between the window piece and centre piece, hereinafter called the isolation zone or zone of thermal mismatch (33), on the base frame (30) corresponds to a similar zone on the wiring substrate (40). The wiring tracks (47) in the zone of expansion mismatch are designed to expand and contract along with the CCS (33) of the base frame (30). The wiring substrate preferably also has a low stiffness in the zone of thermal mismatch.

FIG. 3 shows a cross section of the embodiment represented in FIG. 2. The semiconductor package comprises two parts (see FIG. 3(b)): the base frame (30) and the wiring substrate (40). The base frame (30) comprises a central piece (32) which is of the same size as or bigger than the die (10) to which it is connected to. This centre piece has a coefficient of thermal expansion same as or in the similar range as the die so that when the die is assembled on top of this piece, there will exist little or no coefficient of thermal expansion mismatch. The window part (31) of the base frame (30) is made of a material with a coefficient of thermal expansion which is different from that of the centre piece. Preferably, the coefficient of thermal expansion of the window part matches that of the PWB (70), so that when the PWB is assembled onto this window piece, there will exist little or not coefficient of thermal expansion mismatch. The window piece (31) has a central window cutout which is bigger than the centre piece (23), such that a region is formed between the centre piece and the window piece, i.e. the zone of thermal mismatch.

The centre and window pieces are mechanically or metallurgically joined with compliant connecting structures (CCS) (33) which can deform and accommodate the differential expansion between the centre (32) and window piece (31) during thermal cycling. The CCS (33) can provide a mechanical connection and can also provide a path for heat dissipation. The processes used for joining the centre piece and the window piece may include but are not restricted to high pressure and temperature stamping, soldering, brazing or welding.

The wiring substrate (40) can be separately fabricated on a thin dielectric substrate (41) whose elastic modulus is lower than that of the centre and window pieces. In FIG. 3(c) a dielectric layer (41) is metallized on both the sides of the dielectric layer. The metallization on a first side is a full metal layer (42), whereas the metallization on the second side is patterned such as to realize the electrical wiring and connections. The full metal layer (42) at the first side can provide a ground plane close to the wiring tracks. It can also provide a conductive path for the heat. The package may also include several layers of metallization (43) (45) with repetitions of the thin film deposition processes described previously. This fabrication process may involve the use of thin film technologies such as spin coating of a secondary dielectric material or materials (48) (49), patterning of this dielectric material, electroplating of the metal tracks (43) (45) and solder pads (44) (46) in this pattern, planarizing the dielectric (48) (49)/metal (43) (44) (45) (46) layers to reduce topography variations that may exist and repetition of the above steps for multiple layer build up. Metallization (especially in the case of fine pitch wiring) can also be done with metal deposition followed by lithography and dry/wet etching. In order to optimize the cost of this processing, thin film wiring may only be used on the regions of the substrate that require fine pitch interconnects. The coarse pitch circuitry may be fabricated on the substrate with the help of conventional processing.

The designs of the wiring tracks (47) that lie directly above the CCS (see FIG. 2), i.e. in the region of thermal mismatch, require some modifications from the conventional wiring tracks. The length of the wiring tracks in this zone needs to be greater by at least about 5% than the absolute geometrical minimum dimension required. The wiring substrate and the base frame may be joined together with an adhesive layer (50) which may require application of temperatures above about 40° C. or high pressure or both simultaneously.

Figures 4A, 4B:
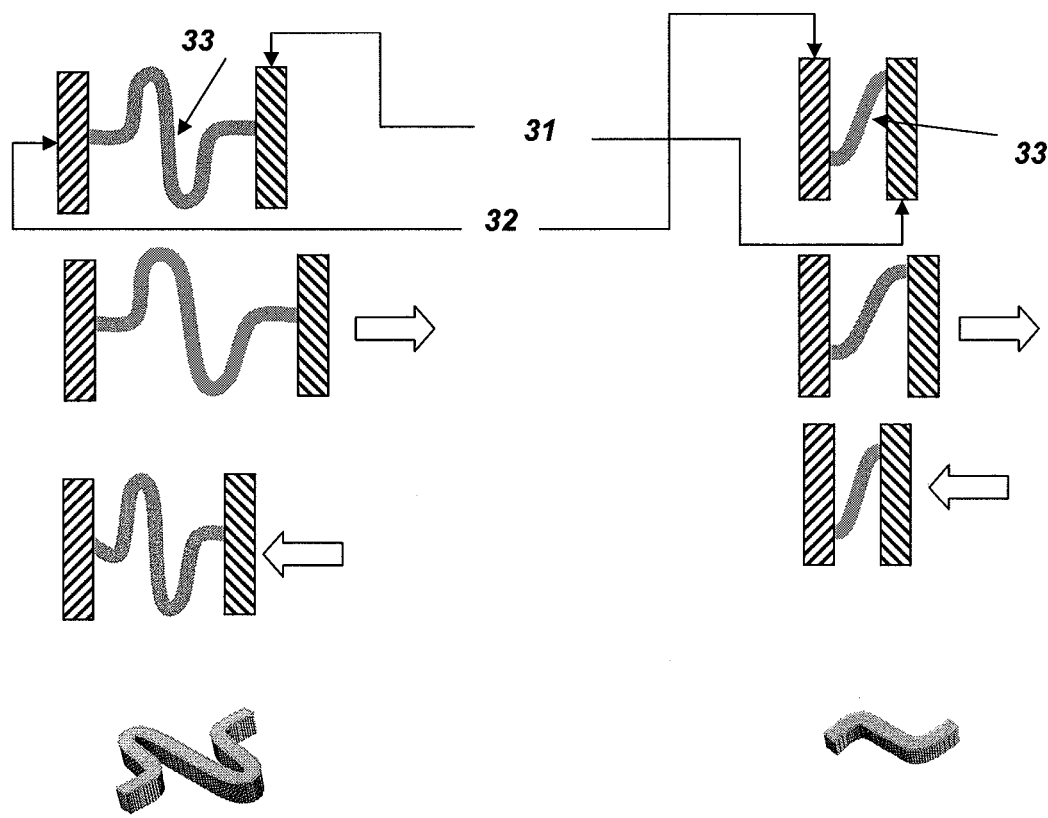
FIGS. 4(a) and 4(b) show a schematic illustration of two shapes of a first embodiment of compliant connecting structures connecting the centre and window piece of the base frame.

A first embodiment of the CSS is shown in FIGS. 4(*a*) and 4(*b*). The main plane of expansion of the window piece and centre piece are in the plane parallel to the board and the die as this dimension is the largest. According to a first embodiment of the CSS, the primary deformation plane of the CCS, i.e. the plane in which the main deformation takes place, is parallel to the main plane of expansion of the window piece and centre piece. This means that the CCS structures or the mechanical connections connecting the mechanical supports with different coefficient of thermal expansion have a lower stiffness to deformation occurring in planes parallel to the planes of expansion and contraction of the mechanical support pieces. Two different shapes of the CSS according to this first embodiment are shown in FIGS. 4(*a*) and 4(*b*), but any other shape considered suitable by the person skilled in the art is possible.

Figure 5A:
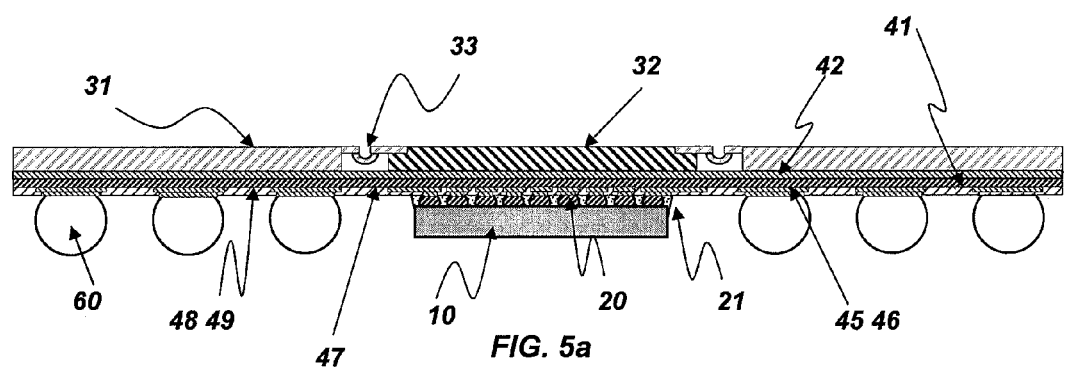
FIG. 5(a) shows a cross section of a semiconductor package with a particular shape of the compliant connecting structures connecting the centre and window piece of the base frame.
Figure 5B:
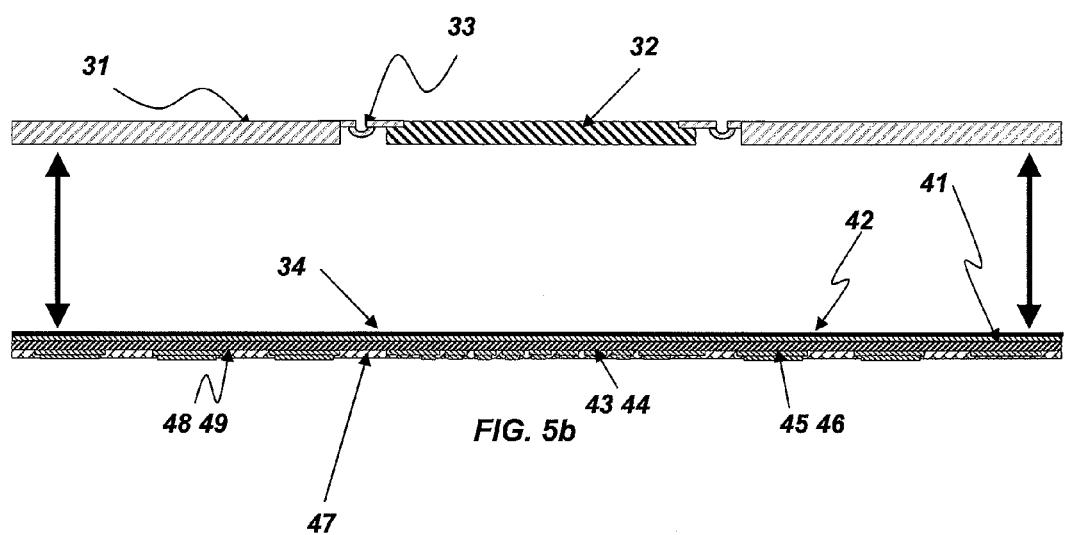
FIG. 5(b) shows a cross section of the wiring substrate and the base frame of the semiconductor package shown in FIG. 5(a).
Figure 6:
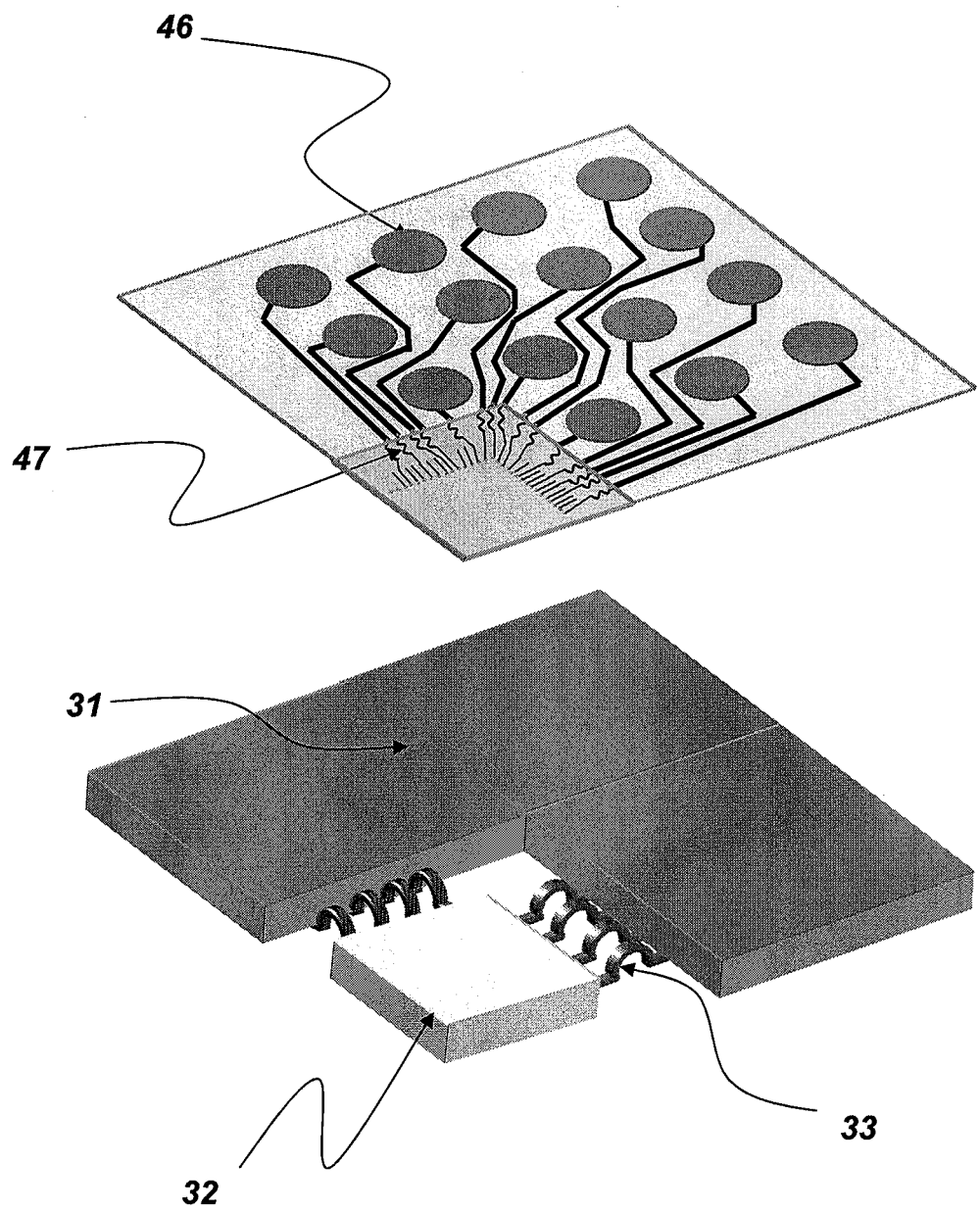
FIG. 6 shows a three-dimensional view of a quarter section of the semiconductor package shown in FIGS. 5(a) and 5(b).
Figure 7A:
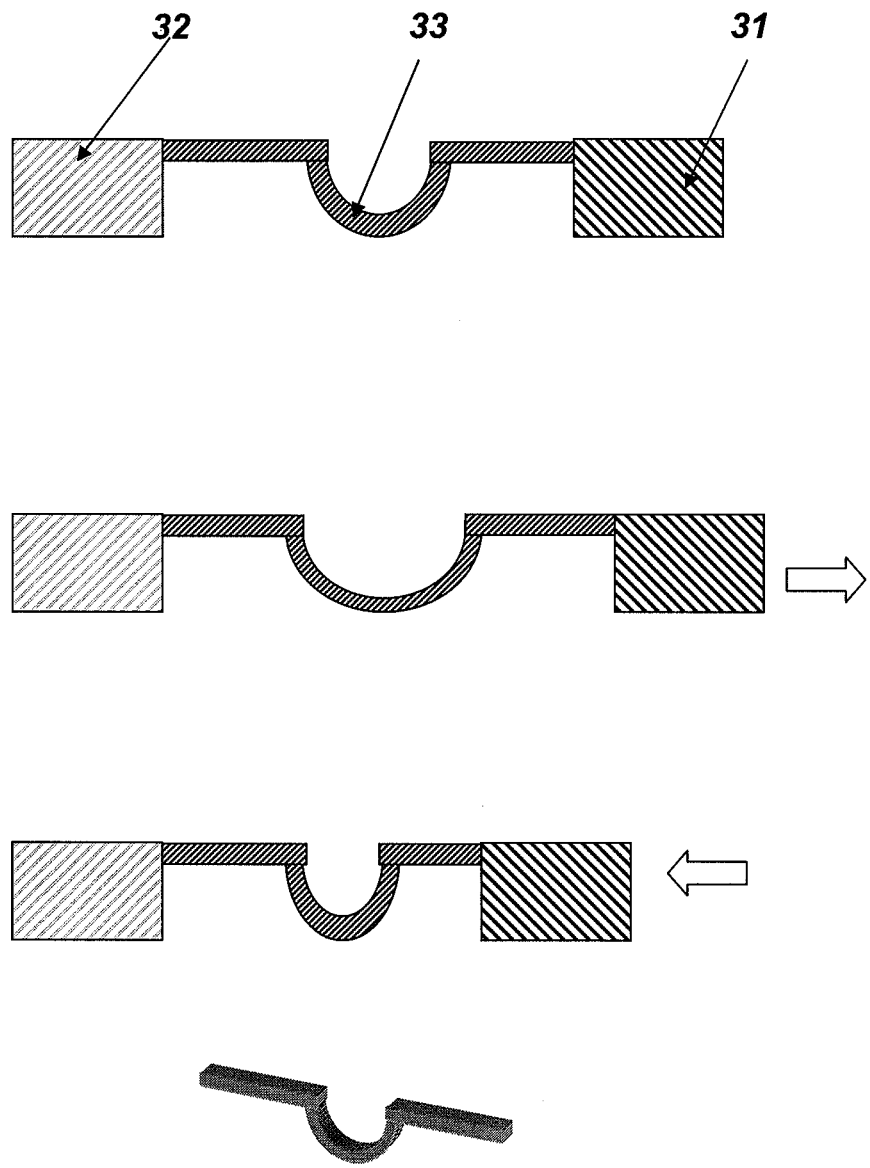
FIGS. 7(a) and 7(b) show a schematic illustration of two shapes of a second embodiment of compliant connecting structures connecting the centre and window piece of the base frame.
Figure 7B:

A second embodiment of the CSS is shown in FIGS. 7(*a*) and 7(*b*). The primary deformation plane of the CCS is perpendicular to the main plane of expansions of the centre and window piece. In this case the CCS structures (33) deform in a plane perpendicular to the main plane of expansion and contraction of the centre and the window piece. This means that the CCS structures or the mechanical connections connecting the mechanical supports with different coefficient of thermal expansion have a lower stiffness to deformation occurring in planes perpendicular to the planes of expansion and contraction of the mechanical support pieces. Two different shapes of the CSS according to this first embodiment are shown in FIGS. 7(*a*) and 7(*b*), but any other shape considered suitable by the person skilled in the art is possible. FIG. 5(*a*) shows a cross section of a package with a particular shape of the CCS according to the second embodiment. In FIG. 5(*b*), the schematic assembly of the wiring substrate and the base frame for the package is shown. FIG. 6 is a three-dimensional view of a quarter section of the semiconductor device shown in FIG. 5(*b*).

The CCS (33) may also show a deformation in any other direction with respect to the main plane of expansion of the window piece and centre piece or may show components with a deformation parallel and components with a deformation perpendicular to the main plane of expansion and contraction.

Figure 8:
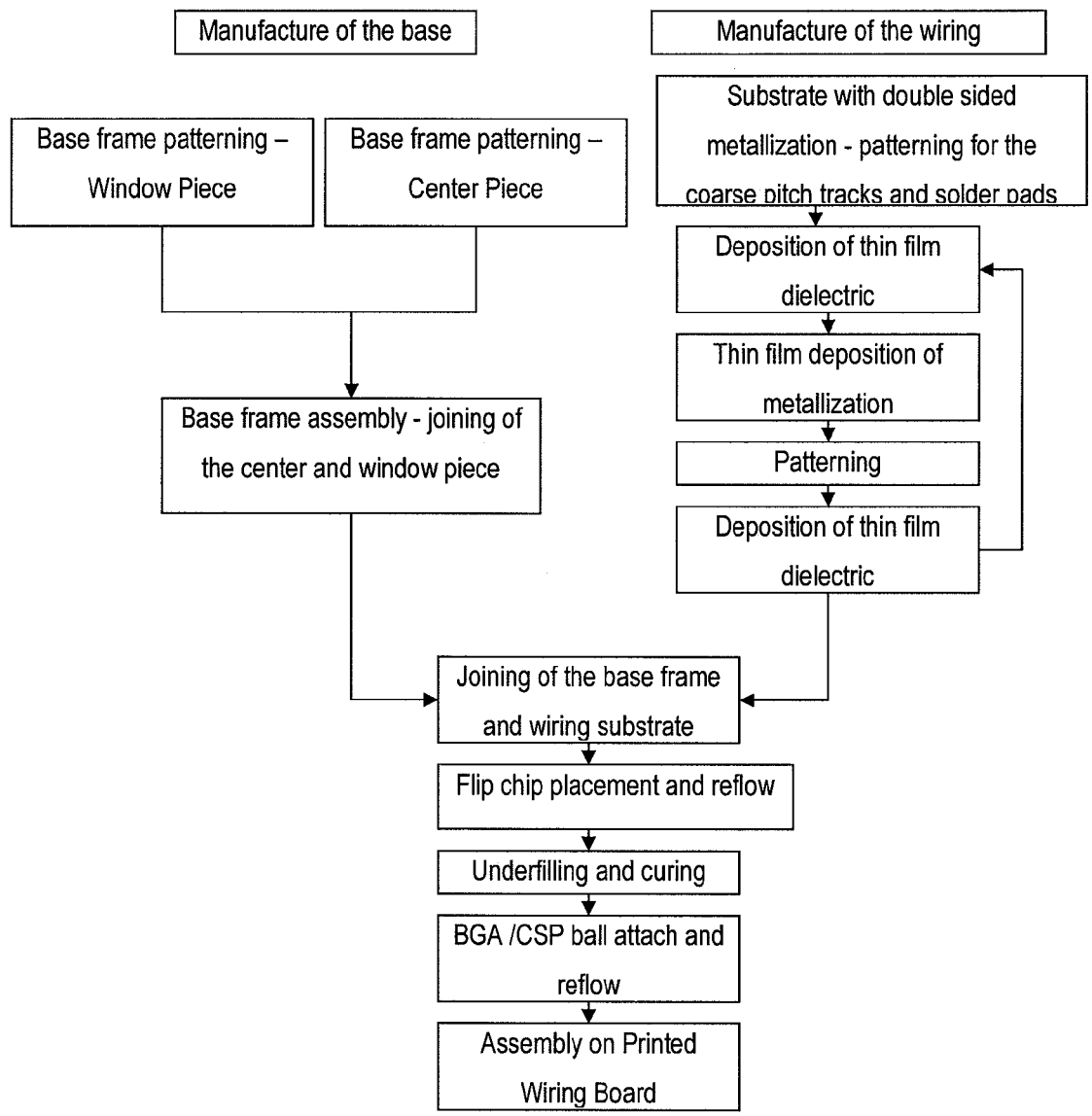
FIG. 8 shows a process flow for manufacturing of a semiconductor package according to one embodiment and its connection to an integrated circuit die and printed wiring board.

FIG. 8 represents a process flow for fabricating semiconductor packages according to one embodiment, for example as illustrated in FIGS. 3(*a*) and 5(*a*). This process flow comprises of the following. A base frame is assembled by joining a centre piece and a window piece. The fabrication of the semiconductor device further involves a separate fabrication of a wiring substrate. The wiring substrate fabrication involves formation of wiring tracks on a dielectric material. The wiring substrate and the base frame are then joined, for example, with adhesives using a lamination process. The resulting interposer substrate is then used in a flip chip package assembly as shown in FIGS. 3(*a*) and 5(*a*).

Another alternative process flow for the fabrication of the package which is not illustrated here involves fabrication of the base frame as described above. The dielectric material used in the fabrication of the wiring substrate with part of the wiring tracks fabricated with conventional processes, is then joined to the base frame, for example with an adhesive using a lamination process. This partially fabricated interposer substrate is then used as a base to fabricate the finer scale wiring tracks with thin film processing. The resulting interposer substrate is then used in the flip chip package assembly as illustrated in FIG. 8.

Figure 9:
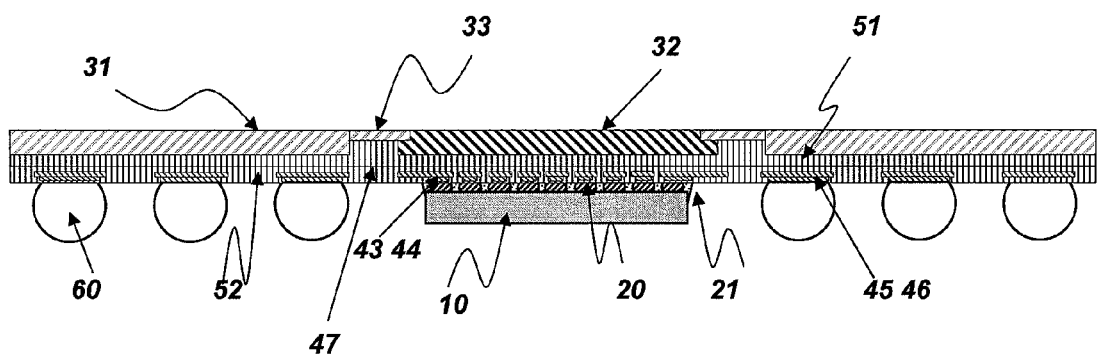
FIG. 9 shows a cross section of another embodiment of the semiconductor package.
Figure 10:
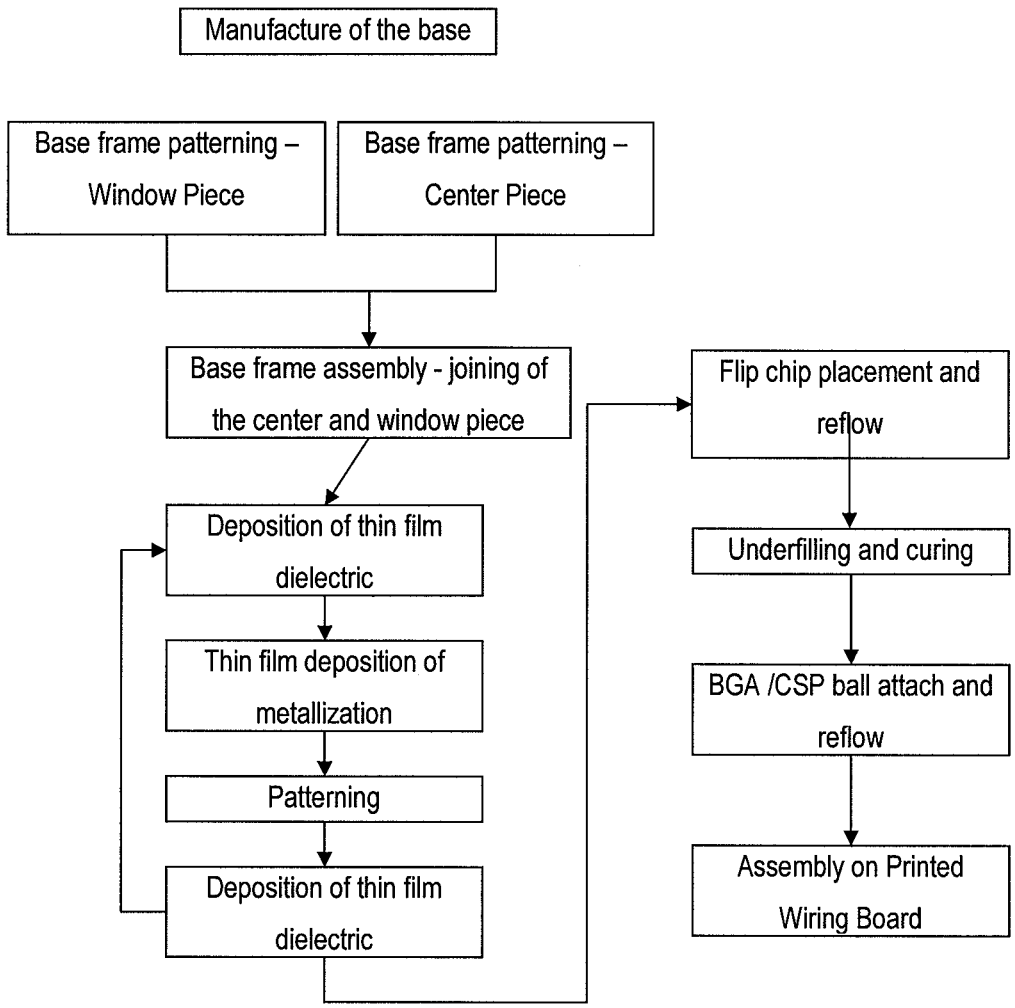
FIG. 10 shows a process flow for manufacturing an embodiment of a semiconductor package, for example as illustrated in FIG. 9.

FIG. 9 shows another embodiment of a semiconductor package according to one embodiment. FIG. 10 represents the process flow for the package illustrated in FIG. 9. The base frame is first manufactured in two pieces with different thermal expansion coefficients, i.e. the centre piece and the window piece, which are then connected with CSS, as described above. The CSS shapes may deform in a plane parallel to the plane of expansion and contraction of the centre and the window piece or may deform perpendicular to the aforementioned plane, or may be a combination of both. A liquid dielectric material (51) is then deposited on the base frame and planarized to provide a flat surface. This surface is metalized and patterned to form tracks and pads (43) (44) (45) (46). Another dielectric layer (52) is then be deposited. Although the schematic shows only a single layer of metallization, the package may also include several layers of metallization with repetitions of the thin film deposition processes described previously.

The semiconductor device according to one embodiment can be used for packaging a die (10). To this end the wiring substrate preferably has bond pads on one side of the substrate that match the bond pads on the die and which are connected to the die bond pads with an electrically conductive material. The die is connected to the centre piece of the interposer substrate, which has a coefficient of thermal expansion matching with that of the die, such that stresses are reduced. Wiring tracks that connect the bond pads on the substrate to other bond pads elsewhere on the substrate typically have larger dimensions to match with the corresponding bond pads on the printed circuit board.

In FIG. 9, the wiring substrate is built on the base frame as described previously. The integrated circuit is then assembled on the interposer substrate with flip chip attachment of the solder bumps (20) and underfilling the flip chip assembly with a liquid underfill material (21), resulting in a flip-chip like package. This is followed by attaching solder spheres (60) on the solder pads (46). These solder spheres (60) can be used to connect the flip-chip like package to a printed wiring board (70). The main improvement with respect to a standard flip chip package is the matching of low and high CTE portions of the substrate with the die and the printed wiring board and related approaches to fabricate the substrate.

Figure 11:
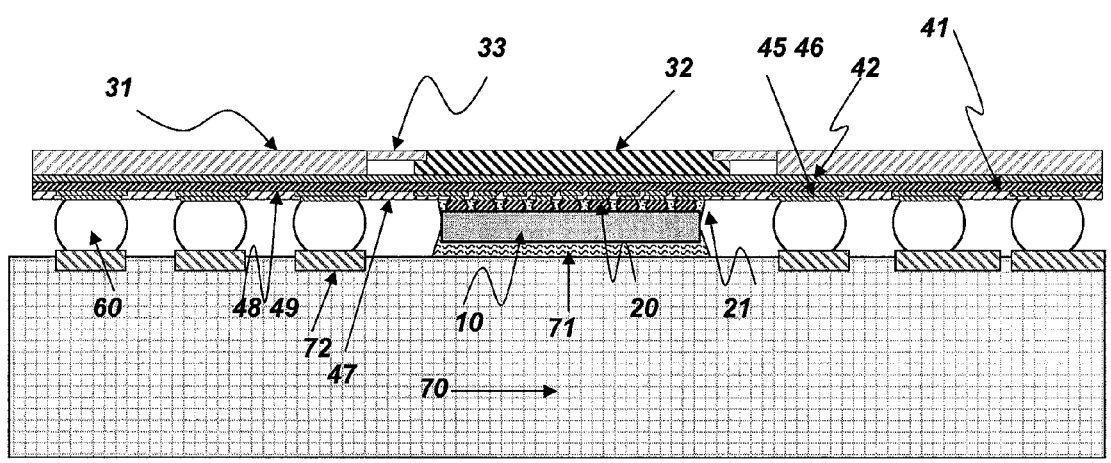
FIG. 11 shows a cross section of the semiconductor package shown in FIG. 3, assembled on a printed circuit board.
Figures 12A, 12B:
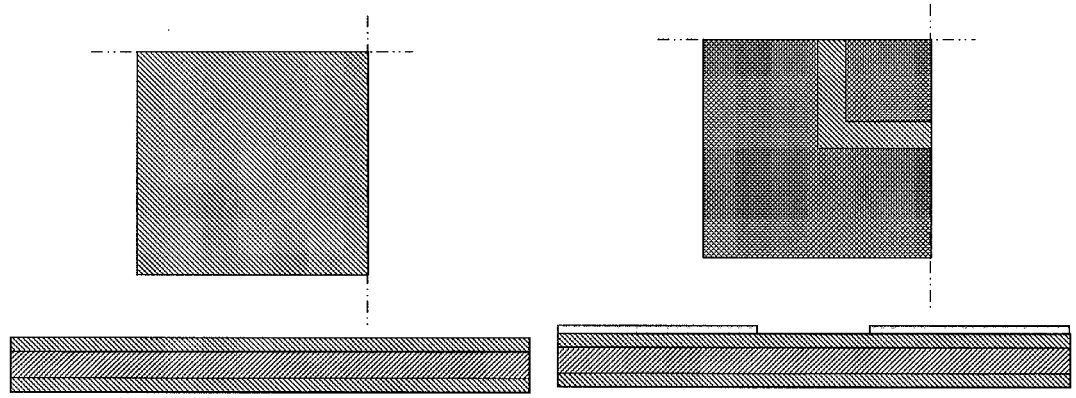
Figures 12C, 12D:
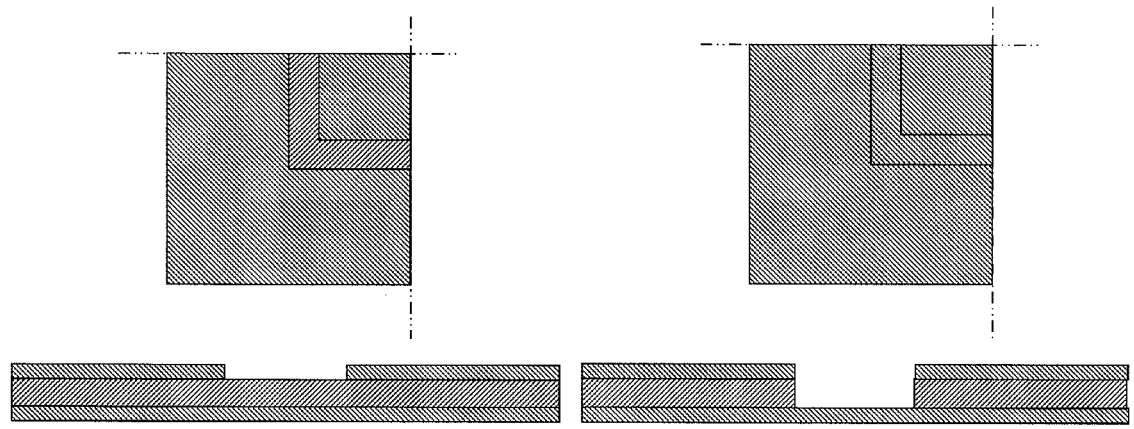
Figure 12G:
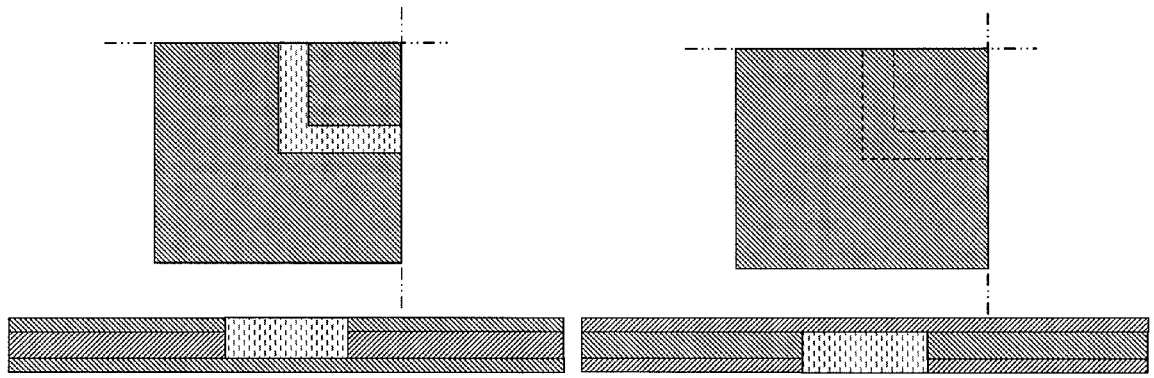
Figure 12G:
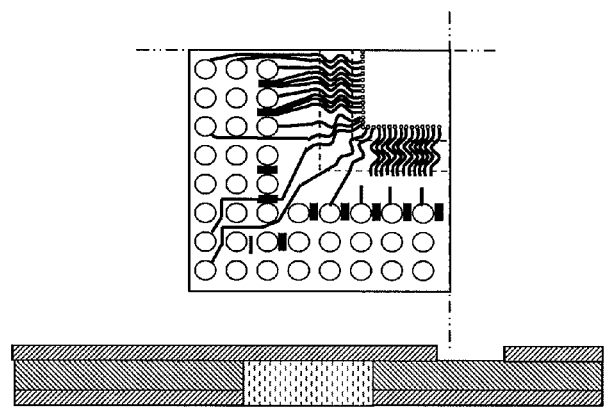

FIG. 11 shows a schematic representation of a package assembled on a board (70). This embodiment relates to the assembly of packages, for example as illustrated but not limited to the packages described in the different embodiments. For improved heat dissipation, during assembly, the package may be mounted on a PWB (70) with a thermally conductive material (71) deposited directly underneath the die. The modulus of the material (71) is lower than that of the PWB to prevent stress on the die during operation. Preferably the modulus of the material (71) is at least about 50 times lower than that of the PWB. This provides another heat conduction path from the die to the ambient. On FIG. 11 it is further shown that the solder spheres (60) are used to connect bond pads of the substrate to corresponding bond pads (72) on the PWB (70).

FIGS. 12(*a*)-12(*g*) show a schematic process flow for a wiring substrate that can accommodate the differential expansions of centre piece and the window piece of the base frame. For each step a top view of a quarter section of the wiring substrate and a cross section of the wiring substrate is shown. In this particular embodiment, the starting material used for making the wiring substrate is a double sided flexible substrate as shown in FIG. 12(a), for instance a dielectric material which is on both sides metalized. The first step in the fabrication of the wiring substrate shown in FIG. 12(b) involves deposition of a photo-resist material on the upper metal layer and patterning the photo-resist material matching the shape of the space between the centre piece and the window piece of the base frame or matching a modified version of the shape. Following this, part of the upper metal layer is removed from the substrate by chemical or physical removing techniques, for example by etching with a suitable etching chemical, thereby exposing the underlying substrate core material, as shown in FIG. 12(c). This exposed material is then removed with another suitable technique as shown in FIG. 12(d). In a next step shown in FIG. 12(e), the thus formed cavity is filled with a dielectric material that has a lower modulus than the core material of the substrate. An example of such a material is for instance silicone (PDMS). The circuit or structures such as micro-vias may be fabricated on this side of the substrate using standard fabricating techniques. In a next step, the substrate is turned around (FIG. 12(f)) and the wiring is fabricated on the second side as shown in FIG. 12(g). The wiring may be designed such that it can deform without breaking. Following this, the second side is covered with a material that is same or similar to the lower modulus material used to fill the window structure. This layer is then patterned to expose the flip chip bonding pads and the other bonding structures.

Figure 13:
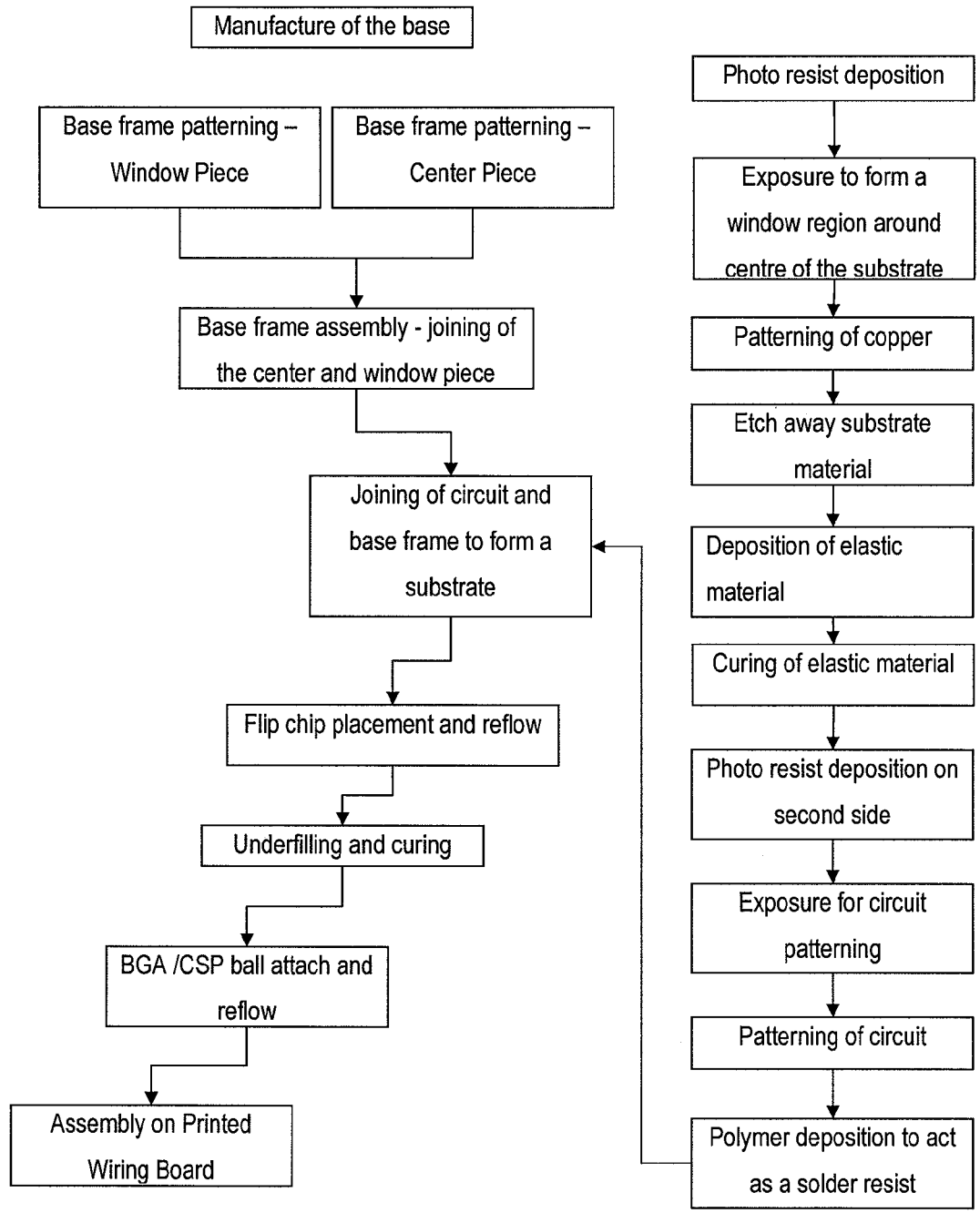
FIG. 13 shows a process flow for manufacturing an embodiment of a semiconductor package, for example as illustrated in FIG. 12
Figure 14:
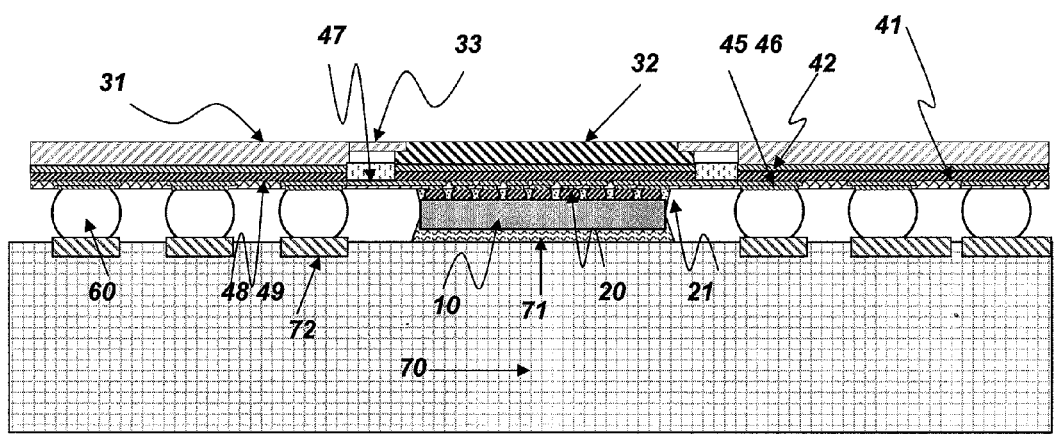
FIG. 14 shows a cross section of an embodiment of the semiconductor package as described in FIGS. 12 and 13, assembled on a printed circuit board

The process flow for a package made with the above described substrate is detailed in FIG. 13. An assembled package made with such a substrate is schematically represented in FIG. 14.

Figure 15:
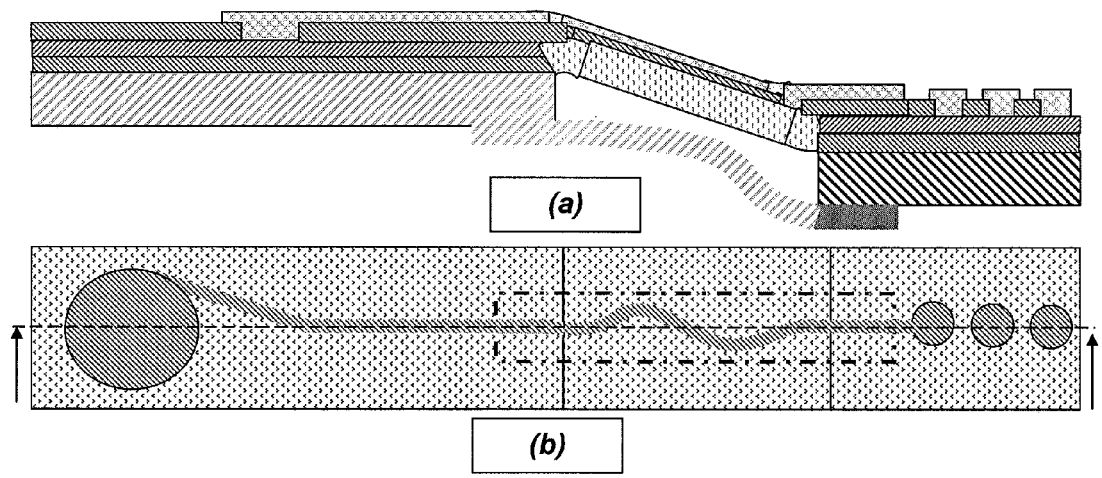
FIG. 15(a) shows a schematic representation of another embodiment of the semiconductor package in which the centre piece and the attached circuit is displaced so that the centre piece is located in a plane that is parallel to the plane of the base frame.
FIG. 15(b) shows a top view of the semiconductor package of FIG. 15(a).
Figure 16:
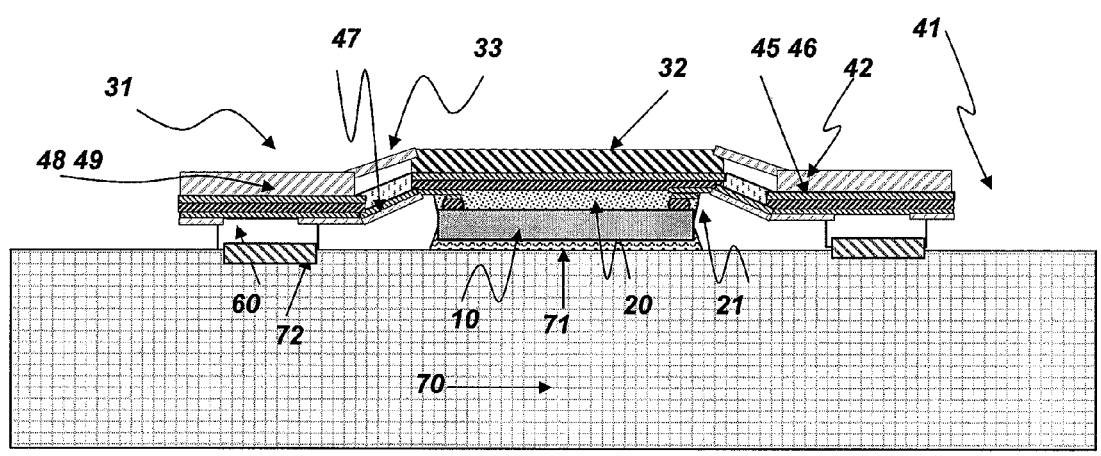
FIG. 16 shows a schematic representation of a semiconductor package made with embodiment as shown in FIG. 15, assembled on a printed circuit board

FIG. 15 and FIG. 16 are schematic representations of yet another embodiment of the semiconductor device in which the centre piece is displaced from the plane of the window piece of the base frame to accommodate thicker dies or interconnections with smaller height.

Figure 17:
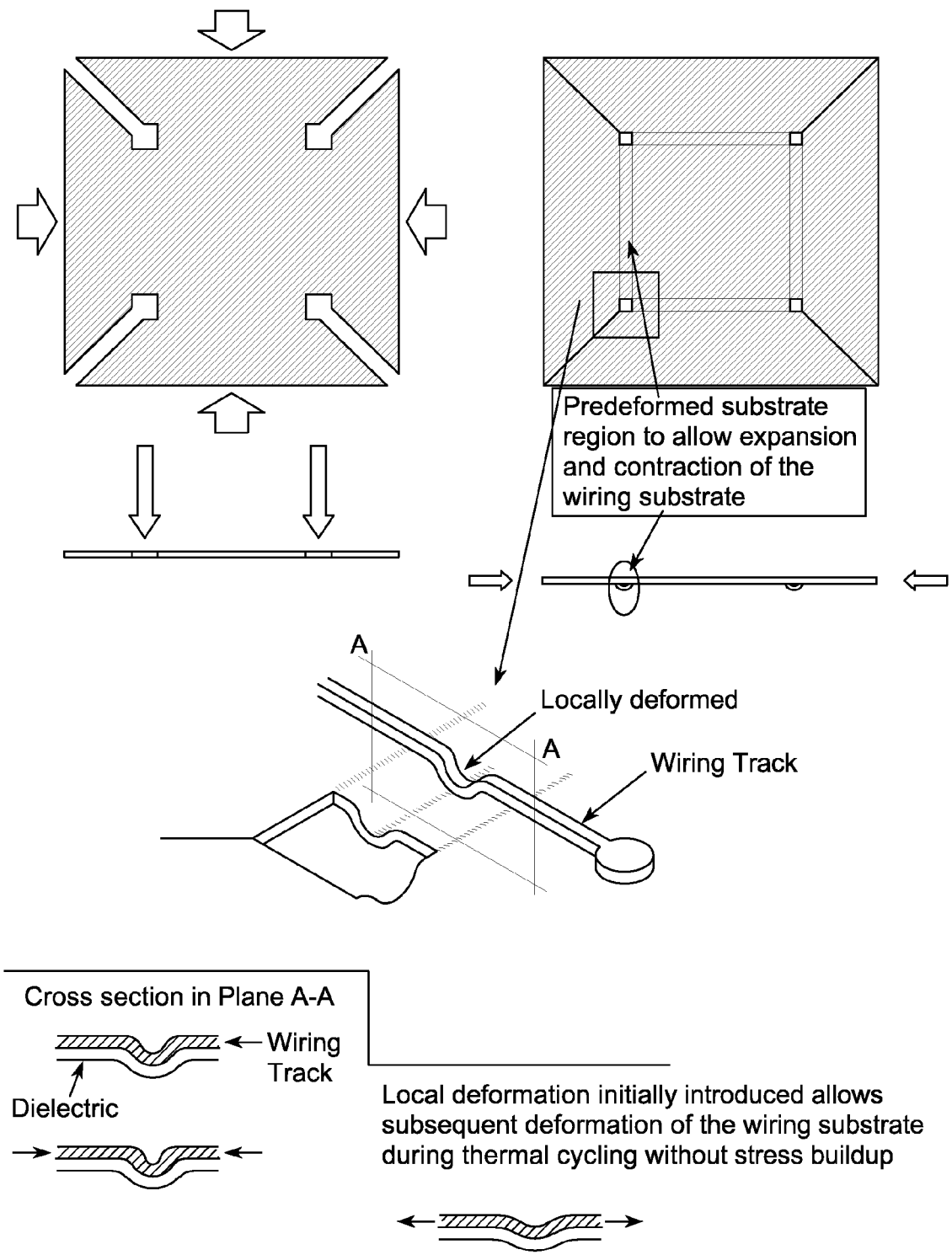
FIG. 17 illustrates yet another embodiment of the wiring substrate where selected pre-deformation is included in the wiring substrate to allow for local deformation of the wiring substrate.

FIG. 17 illustrates a substrate design that pre-deforms the region of the wiring substrate next to the gap between the centre piece and the window piece of the base frame. This pre-deformation allows the substrate wiring tracks to accommodate the expansion difference between the centre piece and the window piece in the package.

Figure 18:
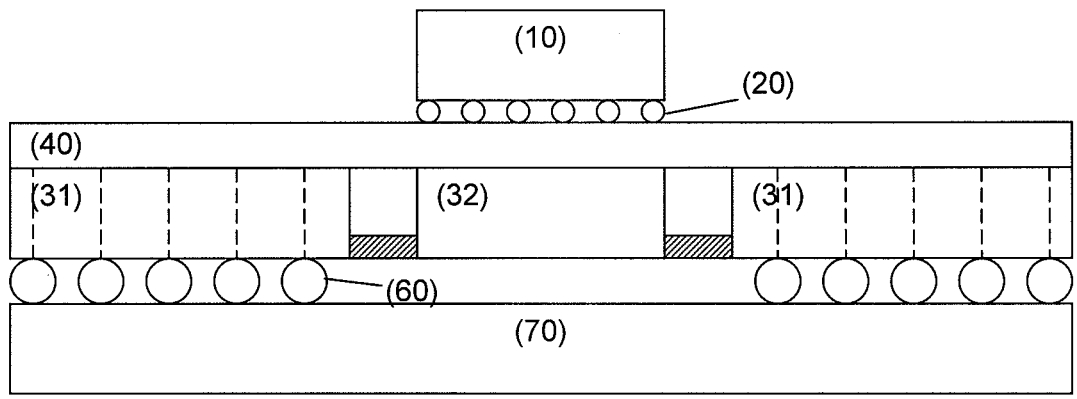
FIG. 18 is a cross section of an embodiment of the semiconductor package.
Figure 19:
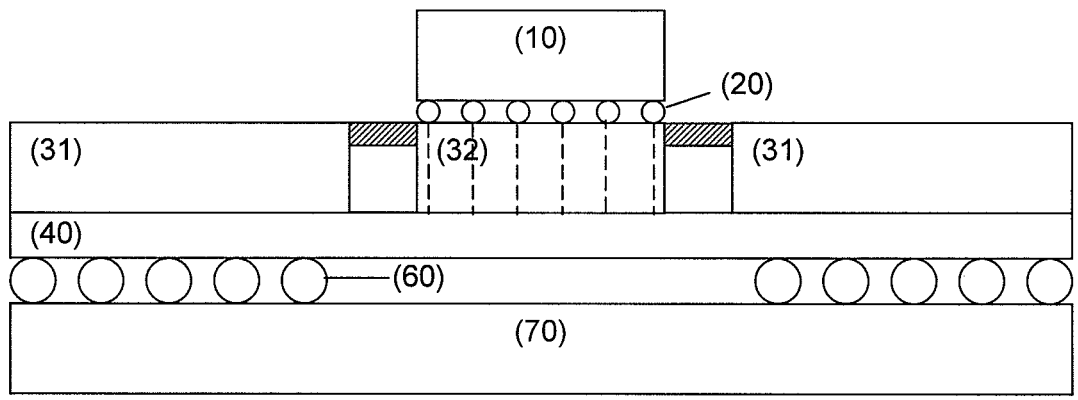
FIG. 19 is a cross section of an embodiment of the semiconductor package.

In the embodiment shown in FIG. 11, the IC die (10) and the PWB (70) are connected on the same side of the semiconductor package. FIGS. 18 and 19 show two embodiments of a semiconductor package, wherein the IC die and the PWB are connected to opposite sides of the semiconductor package. In FIG. 18, the first bond pads are connected with the second bond pads via vertical electrical wiring tracks through the second part (31) of the base frame, whereas in FIG. 19 the connection is done via vertical electrical wiring tracks through the first part (32) of the base frame.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A semiconductor package comprising:
an interposer substrate provided for electrically connecting an integrated circuit die to a printed wiring board, the interposer substrate comprising:
a base frame provided to mechanically support the integrated circuit die on the printed wiring board,
first bond pads provided for being electrically connected to bond pads of the integrated circuit die, and
second bond pads electrically connected to the first bond pads and provided for being electrically connected to bond pads of the printed wiring board,
wherein the base frame comprises a first piece provided for being fixed to the integrated circuit die, and a second piece provided for being fixed to the printed wiring board, the first and second pieces being made of a material with respectively a predetermined first and a second coefficient of thermal expansion,
wherein the first coefficient of thermal expansion of the first piece is chosen to match a coefficient of thermal expansion of the integrated circuit die and the second coefficient of thermal expansion of the second piece is chosen to match a coefficient of thermal expansion of the printed wiring board,
wherein the first and the second piece of the base frame are connected to each other via deformable connecting structures defining a zone of expansion mismatch between the first and the second piece, the connecting structures being provided to compensate for a different thermal expansion of the first and second pieces,
wherein the interposer substrate further comprises a wiring substrate mounted onto the base frame and comprising electric wiring tracks providing the electric connection between the first and second bond pads, the electrical wiring tracks having flexible parts in the zone of expansion mismatch which are provided to expand and contract along with the deformable connecting structures of the base frame.

2. The semiconductor package according to claim 1, wherein the first piece of the base frame is a centre piece and the second piece of the base frame is a window piece surrounding the centre piece.

3. The semiconductor package according to claim 1, wherein the first and second bond pads are provided on the wiring substrate.

4. The semiconductor package according to claim 1, wherein the difference between the first/second coefficient of thermal expansion and the coefficient of thermal expansion of the integrated circuit die/printed wiring board is less than about 20%.

5. The semiconductor package according to claim 4, wherein the difference between the first/second coefficient of thermal expansion and the coefficient of thermal expansion of the integrated circuit die/printed wiring board is less than about 10%.

6. The semiconductor package according to claim 1, wherein a main plane of thermal expansion of the first and the second pieces is parallel to a main plane of thermal expansion of at least one of the deformable connecting structures.

7. The semiconductor package according to claim 1, wherein a main plane of thermal expansion of the first and the second piece is perpendicular to a main plane of thermal expansion of at least one of the deformable connecting structures.

8. The semiconductor package according to claim 1, wherein the wiring substrate comprises a dielectric layer, a first and a second metallic layer provided on opposite sides of the dielectric layer, the first metallic layer being a full metallic layer on the side of the base frame, the second metallic layer being patterned to form the electrical wiring tracks and bond pads.

9. The semiconductor package according to claim 8, wherein the semiconductor package further comprises an adhesive layer provided to connect the first metallic layer to the base frame.

10. The semiconductor package according to claim 1, wherein the first and second pieces are located in the same plane.

11. The semiconductor package according to claim 1, wherein the first piece extends in a different plane as the second piece.

12. The semiconductor package according to claim 1, wherein the first coefficient of thermal expansion is between about 2 to 9 ppm/° C.

13. The semiconductor package according to claim 1, wherein the second coefficient of thermal expansion is between about 14 to 19 ppm/° C.

14. A method of manufacturing a semiconductor package, the method comprising:
(a) selecting a material with a first predetermined coefficient of thermal expansion for a first piece of a base frame and manufacturing the first piece, the base frame being provided to mechanically support an integrated circuit die on a printed wiring board, the first piece being provided for being fixed to the integrated circuit die, the first coefficient of thermal expansion being chosen to match a coefficient of thermal expansion of the integrated circuit die;
(b) selecting a material with a second predetermined coefficient of thermal expansion for a second piece of the base frame and manufacturing the second piece, the second piece being provided for being fixed to the printed wiring board, the second coefficient of thermal expansion being chosen to match a coefficient of thermal expansion of the printed wiring board;
(c) connecting the first and second pieces with a deformable connecting structures;
(d) manufacturing a wiring substrate;
(e) connecting the wiring substrate with a first side to the base frame;
(f) connecting the wiring substrate with a first part of a second side corresponding to the first piece of the base frame to an integrated circuit die and with a second part of a second side corresponding to the second piece of the base frame to a printed wiring board.

15. The method according to claim 14, wherein the process (d) comprises:
(i) providing a dielectric substrate;
(ii) providing a first side of a dielectric layer with a full metal layer to form a first side of the wiring substrate; and
(iii) providing a second side of the dielectric layer with bond pads and electrical wiring tracks connecting the bond pads to form a second side of the wiring substrate.

16. The method according to claim 14, wherein the processes (d) and (e) comprise:
(i) depositing and curing a liquid dielectric material on the base frame to provide a flat surface on the base frame; and
(ii) providing the flat surface with bond pads and electrical wiring tracks connecting the bond pads.

17. The method according to claim 14, wherein the first coefficient of thermal expansion is between about 2 to 9 ppm/° C.

18. The method according to claim 14, wherein the second coefficient of thermal expansion is between about 14 to 19 ppm/° C.

19. A semiconductor package manufactured by a method according to claim 14.

20. A semiconductor package comprising:
a base frame being provided to mechanically support an integrated circuit die on a printed wiring board, the base frame comprising a first piece made of a material with a first coefficient of thermal expansion and a second piece made of a material with a second coefficient of thermal expansion, and resilient connecting structures connecting the first and second pieces, wherein the first pieces and the second pieces are configured to be fixed to an integrated circuit die and a printed wiring board respectively, wherein the first coefficient of thermal expansion of the first piece is chosen to match a coefficient of thermal expansion of the integrated circuit die and the second coefficient of thermal expansion of the second piece is chosen to match a coefficient of thermal expansion of the printed wiring board; and
a wiring substrate mounted on the base frame, the wiring substrate comprising electric wiring tracks configured to connect first bond pads on the integrated circuit die and second bond pads on the printed wiring board, the electrical wiring tracks comprising flexible parts configured to expand and contract along with the resilient connecting structures of the base frame.

21. A method of manufacturing a semiconductor package, the method comprising providing an interposer substrate for electrically connecting an integrated circuit die to a printed wiring board, the process of providing the interposer substrate comprises:
providing a base frame to mechanically support the integrated circuit die on the printed wiring board, wherein the base frame comprises a first piece provided for being fixed to the integrated circuit die, a second piece provided for being fixed to the printed wiring board, and deformable connecting structures connecting the first piece to the second piece and defining a zone of expansion mismatch between the first and the second piece, the first and second pieces being made of a material with respectively a predetermined first and a second coefficient of thermal expansion, wherein the first coefficient of thermal expansion of the first piece is chosen to match a coefficient of thermal expansion of the integrated circuit die and the second coefficient of thermal expansion of the second piece is chosen to match a coefficient of thermal expansion of the printed wiring board, the connecting structures being provided to compensate for a different thermal expansion of the first and second pieces;
providing first bond pads for being electrically connected to bond pads of the integrated circuit die and second bond pads for being electrically connected to bond pads of the printed wiring board, the second bond pads being electrically connected to the first bond pads; and mounting a wiring substrate onto the base frame, the wiring substrate comprising electric wiring tracks providing the electric connection between the first and second bond pads, the electrical wiring tracks having flexible parts in the zone of expansion mismatch which are provided to expand and contract along with the deformable connecting structures of the base frame.

* * * * *